United States Patent [19]

Kawase

[11] Patent Number: 5,232,506
[45] Date of Patent: Aug. 3, 1993

[54] FURNACE STRUCTURE OF SEMICONDUCTOR MANUFACTURING APPARATUS

[75] Inventor: Yasuyoshi Kawase, Tokyo, Japan

[73] Assignee: NEC Corporation, Japan

[21] Appl. No.: 818,075

[22] Filed: Jan. 8, 1992

[30] Foreign Application Priority Data

Jan. 10, 1991 [JP] Japan .................. 3-001365

[51] Int. Cl.⁵ .............................................. C23C 16/00
[52] U.S. Cl. .................... 118/719; 118/725; 29/25.01
[58] Field of Search ............... 118/719, 725; 29/25.01

[56] References Cited

U.S. PATENT DOCUMENTS

| | | | |
|---|---|---|---|
| 4,449,037 | 5/1984 | Shibamata | 118/725 |
| 4,636,401 | 1/1987 | Yamazaki | 118/719 |
| 4,817,557 | 4/1989 | Diem | 118/725 |
| 4,825,808 | 5/1989 | Takahashi | 118/715 |
| 4,962,726 | 10/1990 | Matsushita | 118/725 |

FOREIGN PATENT DOCUMENTS

| | | |
|---|---|---|
| 206180 | 12/1986 | European Pat. Off. |
| 59-16328 | 1/1984 | Japan .................. 118/719 |
| 63-109174 | 5/1988 | Japan .................. 118/719 |

OTHER PUBLICATIONS

IBM Tech. Disc. Bull., vol. 32, No. 3B, Aug. 1989, pp. 302-303.
Webster's New Collegiate Dictionary, ©1975, G. & C. Merriam Co., Springfield, Mass., p. 1076.

*Primary Examiner*—Richard Bueker
*Attorney, Agent, or Firm*—Laff, Whitesel, Conte & Saret

[57] ABSTRACT

A furnace structure of a semiconductor manufacturing apparatus includes a process chamber, a pair of preliminary chambers, and shutters. The process chamber has a pair of openings in loading and unloading directions of a semiconductor substrate and is designed to perform a predetermined semiconductor manufacturing process. Each of preliminary chambers has a pair of openings and communicate with the process chamber, with one of each pair of openings opposing a corresponding one of the openings of the process chamber. The shutters are respectively arranged between the two openings of the process chamber and the opposing openings of the pair of preliminary chambers and designed to separate the process chamber from the preliminary chambers so as to be opened/closed.

6 Claims, 3 Drawing Sheets

FURNACE STRUCTURE OF SEMICONDUCTOR MANUFACTURING APPARATUS

BACKGROUND OF THE INVENTION

The present invention relates to a semiconductor manufacturing apparatus and, more particularly, to a diffusion furnace or a vapor phase growth furnace.

FIGS. 2A to 2D illustrate a sequence of operations of a conventional diffusion furnace or vapor phase growth furnace. This furnace comprises a cap-like core tube 1, a heater 2 arranged around the outer surface of the core tube 1, a shutter 3 which is formed at the lower end opening of the core tube 1 and is opened/closed when semiconductor substrates 6 are loaded/unloaded, a gas introduction portion 4 which is connected to the upper central portion of the core tube 1, and an exhaust portion 5 which is connected to the lower inner side wall of the core tube 1 and designed to exhaust gas after reaction (FIG. 2A). When the semiconductor substrates 6 are to be subjected to annealing or a thin-film formation process, the shutter 3 is opened, and a boat 7 having the semiconductor substrates 6 mounted thereon is loaded into the core tube 1 (FIG. 2B). If necessary, a reaction gas is then introduced through the gas introduction portion 4 annealing the substrates 6 (FIG. 2C). Thereafter, the shutter 3 is opened (FIG. 2D) to unload the semiconductor substrates 6 from the core tube 1.

In the conventional diffusion furnace or vapor phase growth furnace, since the semiconductor substrates 6 are loaded and unloaded through the same opening by means of the shutter 3, semiconductor wafers located at upper and lower portions X and Y on the boat 7 in the core tube 1 have different thermal hysteresis. In addition, since atmospheric air flows into the furnace when the shutter 3 is opened, uniformity in film thickness among the respective semiconductor substrates is degraded.

SUMMARY OF THE INVENTION

It is an object of the present invention to provide a furnace structure of a semiconductor manufacturing apparatus, which can eliminate a difference in thermal hysteresis among a plurality of semiconductor substrates located at different mounting positions on a boat.

It is another object of the present invention to provide a furnace structure of a semiconductor manufacturing apparatus, which can prevent atmospheric air from flowing into a furnace when a shutter is opened and closed.

It is still another object to provide a furnace structure of a semiconductor manufacturing apparatus, which can prevent degradation in uniformity in film thickness among semiconductor substrates.

In order to achieve the above objects, according to the present invention, there is provided a furnace structure of a semiconductor manufacturing apparatus, comprising a process chamber, having a pair of openings in loading and unloading directions of semiconductor substrates, a pair of preliminary or outer chambers, each having a pair of openings and communicating with the process chamber, with one of each pair of openings opposing a corresponding one of the openings of the process chamber, and shutters respectively arranged between the two openings of the process chamber and the opposing openings of the pair of preliminary or outer chambers and designed to separate the process chamber from the preliminary or outer chambers so as to be opened/closed.

DESCRIPTION OF THE PREFERRED EMBODIMENT

Figure 1A:
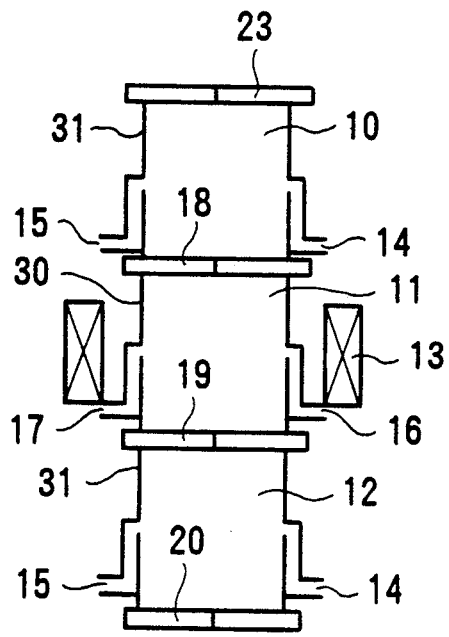
FIGS. 1A to 1E are views showing a sequence of operations of an embodiment of the present invention.

The present invention will be described below with reference to the accompanying drawings. FIGS. 1A to 1E illustrate a sequence of operations of an embodiment of the present invention, which is applied to a vertical type diffusion furnace.

The furnace structure of a semiconductor manufacturing apparatus of this embodiment is constituted by a process chamber 11 and preliminary or outer chambers 10 and 12, as shown in FIG. IA. The process chamber 11 includes a cylindrical core tube 30, a gas introduction portion 16 and an exhaust portion 17 respectively open to the inner surface of the core tube 30, and a heater 13 arranged around the outer surface of the core tube 30. The preliminary or outer chambers 10 and 12 respectively communicate with the upper and lower openings of the process chamber 11. Each preliminary or outer chamber includes a core tube 31 having the same shape as that of the process chamber 11 and a gas introduction portion 14 and an exhaust portion 15 respectively open to the inner surface of the core tube 31. The preliminary or outer chamber 10 and the process chamber 11, and the process chamber 11 and the preliminary or outer chamber 12 are respectively separated from each other by shutters 18 and 19 through the openings. A shutter 20 serving as an entrance is formed at the lower opening of the preliminary or outer chamber 12, whereas a shutter 23 serving as an exit is formed at the upper opening of the preliminary or outer chamber 10.

Figure 1B:
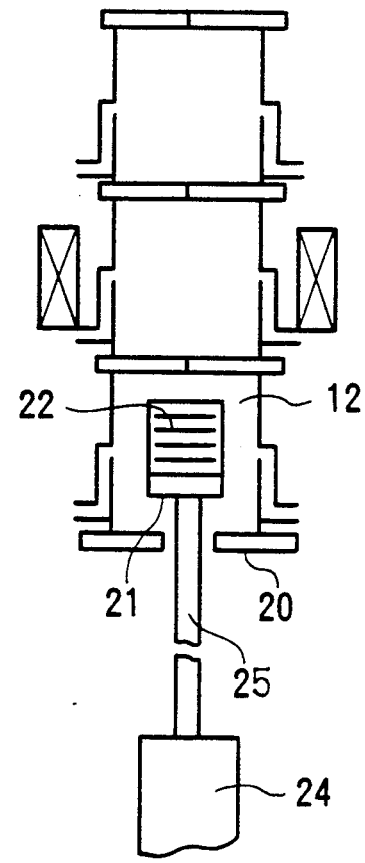
Figure 1C:
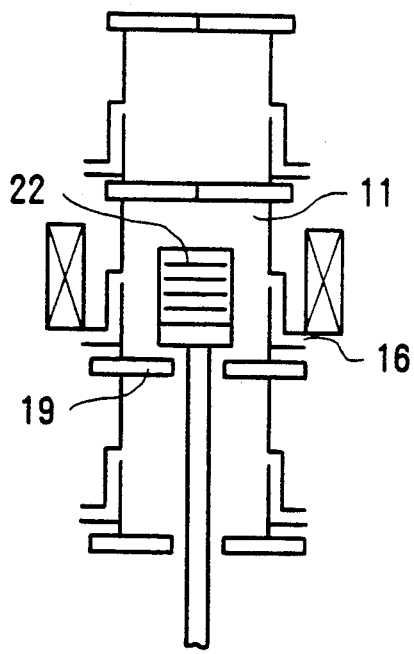

A gas such as nitrogen is introduced into the preliminary or outer chambers 10 and 12 and the process chamber 11 through the gas introduction portions 14 and 16. The shutter 20 is then opened, as shown in FIG. 1B, and a rod 25 is moved upward by a boat movement control unit 24 upon interlocking with the operation of the shutter 20. As a result, semiconductor substrates 22 mounted on a boat 21 fixed to the distal end of the rod 25 are loaded in the preliminary or outer chamber 12. Subsequently, the shutter 20 is closed. After this state is maintained for 1 to 10 minutes, the shutter 19 is opened, and the semiconductor substrates 22 are moved into the process chamber 11 by the rod 25, as shown in FIG. 1C. The rod 25 is retracted and the shutter 19 is closed. An annealing or a thin-film formation process as a semiconductor manufacturing process is performed with respect to the semiconductor substrates 22 by using a predetermined reaction gas (if necessary) introduced through the gas introduction portion 16 and the heater 13.

Figure 1D:
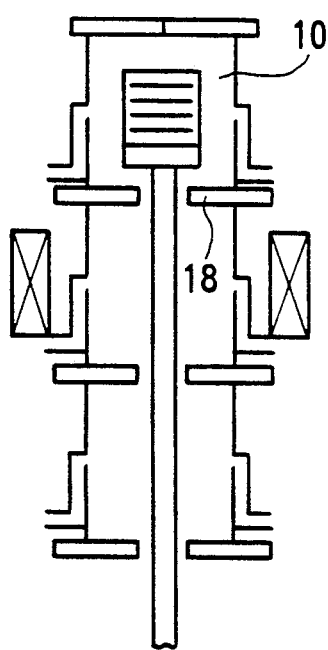
Figure 1E:
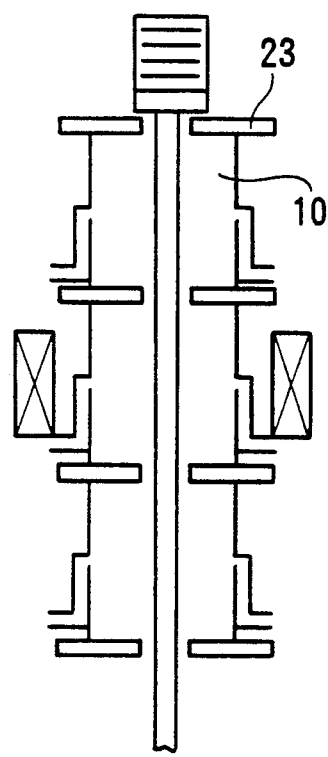
Figure 2A:
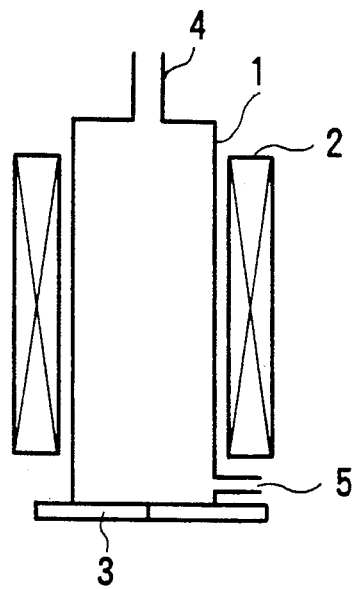
FIGS. 2A to 2D are views showing a sequence of operations of a conventional semiconductor manufacturing apparatus.
Figure 2B:
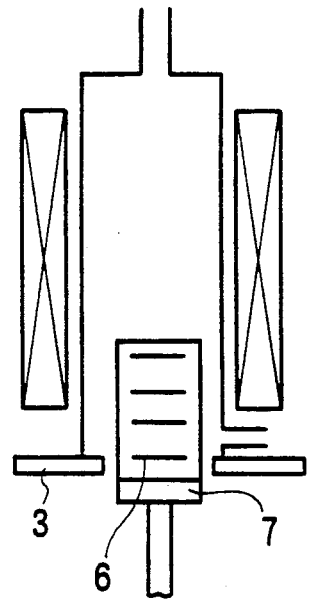
Figure 2C:
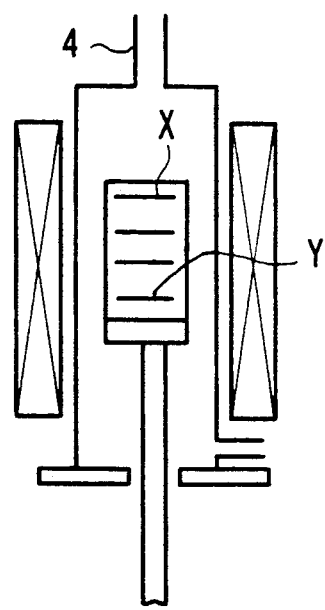
Figure 2D:
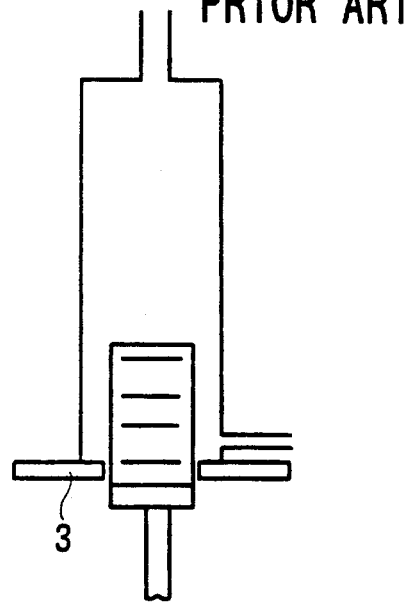

As shown in FIG. 1D, when the annealing or the thin-film formation process is completed, the shutter 18 is opened, and the semiconductor substrates 22 are moved by the rod 25 into the preliminary or outer chamber 10 in which a gas such as nitrogen is introduced. The rod 25 is retracted and the shutter 19 is closed. After the semiconductor substrates 22 are cooled in the preliminary or outer chamber 10, the shutter 23 is opened, and the substrates 22 are unloaded to the outer atmosphere (FIG. 1E).

As has been described above, according to the semiconductor manufacturing apparatus having a diffusion furnace or a vapor phase growth furnace, since semiconductor substrates are loaded through one opening of the process chamber and unloaded through the other opening, a uniform thermal hysteresis can be realized among the semiconductor substrates (in a batch). In addition, since the preliminary or outer chambers are respectively arranged on the loading and unloading sides of the process chamber, entrance of atmospheric air into the process chamber can be prevented at the time of loading. These improve uniformity in film thickness among semiconductor substrates to 1/5 or less than that obtained by the conventional apparatus.

What is claimed is:

1. A vertical type furnace structure for a semiconductor manufacturing apparatus, said furnace comprising:
   process chamber including a cylindrical core tube having a a circumferential surface with a gas introduction portion and an exhaust portion formed therein;
   a heater surrounding an outer surface of said core tube;
   said process chamber having a pair of openings respectively for loading and unloading semiconductor substrates;
   a pair of outer chambers, each having a pair of openings and communicating with said process chamber, with one of each pair of openings opposing a corresponding one of the openings of said process chamber; and
   shutters at each of the openings of said process chamber and the opposing openings of said pair of outer chambers for separating said process chamber from said outer chambers so that said shutters are opened and closed to enable said substrates to enter and leave said process chamber.

2. A structure according to claim 1, further comprising other shutters, each being arranged to be opened and closed at the other of said openings of each of said outer chambers to separate said outer chambers from an outer atmosphere.

3. A structure according to claim 1, further comprising a boat, movement control means for loading semiconductor substrates mounted on a boat through an opening of one of said outer chambers, and unloading the semiconductor wafer through the other of said openings of said other outer chamber after a predetermined semiconductor manufacturing process is performed in said process chamber.

4. A structure according to claim 1, wherein each of said outer chambers comprises a cylindrical core tube having a gas introduction portion and an exhaust portion formed in a circumference surface thereof.

5. A structure according to claim 1, wherein the semiconductor manufacturing process performed in said process chamber is annealing.

6. A structure according to claim 1, wherein the semiconductor manufacturing process performed in said process chamber is a thin-film formation process.

* * * * *